(12) United States Patent
Nakajima

(10) Patent No.: US 7,952,148 B2
(45) Date of Patent: May 31, 2011

(54) METHOD OF MANUFACTURING SEMICONDUCTOR DEVICE AND SEMICONDUCTOR DEVICE

(75) Inventor: Kazuaki Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/929,333

(22) Filed: Jan. 14, 2011

(65) Prior Publication Data

US 2011/0101468 A1    May 5, 2011

Related U.S. Application Data

(62) Division of application No. 12/403,780, filed on Mar. 13, 2009, now Pat. No. 7,892,913.

(30) Foreign Application Priority Data

Apr. 25, 2008    (JP) ................................. 2008-115594

(51) Int. Cl.
*H01L 29/94* (2006.01)
*H01L 29/76* (2006.01)

(52) U.S. Cl. .... 257/369; 257/410; 257/411; 257/E27.06

(58) Field of Classification Search ................... 257/369, 257/388, 410–412, E27.06, E27.062
See application file for complete search history.

(56) References Cited

U.S. PATENT DOCUMENTS

| 7,030,430 B2 * | 4/2006 | Doczy et al. ................... 257/249 |
| 2001/0023120 A1 | 9/2001 | Tsunashima et al. |
| 2002/0084450 A1 | 7/2002 | Cho |
| 2009/0108294 A1 | 4/2009 | Choi et al. |

FOREIGN PATENT DOCUMENTS

| JP | 2002-289849 | 10/2002 |
| JP | 2002-343790 | 11/2002 |
| JP | 2003-31675 | 1/2003 |
| JP | 2005-150543 | 6/2005 |
| JP | 2005-294422 | 10/2005 |
| JP | 2007-243009 | 9/2007 |
| WO | WO 2004/073072 A1 | 8/2004 |

* cited by examiner

*Primary Examiner* — Thanhha Pham
(74) *Attorney, Agent, or Firm* — Finnegan, Henderson, Farabow, Garrett & Dunner, L.L.P.

(57) ABSTRACT

A semiconductor device according to the embodiments comprises a gate insulator formed on a substrate, the gate insulator including a high-dielectric film in whole or part, a reaction film including a first metal on the gate insulator; a metal film including a second metal on the reaction film; and a film including Si formed on the metal film.

9 Claims, 12 Drawing Sheets

METHOD OF MANUFACTURING SEMICONDUCTOR DEVICE AND SEMICONDUCTOR DEVICE

CROSS-REFERENCE TO RELATED APPLICATIONS

This application is a divisional of U.S. patent application Ser. No. 12/403,780, filed on Mar. 13, 2009 now U.S. Pat. No. 7,892,913; the entire contents of which are incorporated herein by reference.

BACKGROUND OF THE INVENTION

1. Field of the Invention

The present invention relates to a method of manufacturing a semiconductor device and to a semiconductor device, and in particular, relates to a method of manufacturing a kind of a semiconductor device which has a metal electrode structure and to such semiconductor device.

2. Description of the Related Art

Conventionally, in an attempt to achieve a high performance semiconductor device, downsizing of a MOSFET (metal oxide semiconductor field effect transistor) has been in progress. Downsizing of a MOSFET can be achieved, for example, by thinning down a silicon oxide film ($SiO_2$ film) which is to serve as a gate insulator. When the $SiO_2$ film is thinned down, however, gate leakage current will increase due to tunnel current. Therefore, with a post-0.1 μm generation device, there has been a limit to how far the gate insulator can be thinned. Furthermore, with such post-0.1 μm generation device, depletion occurring in the gate electrode is a serious matter which cannot be disregarded. Accordingly, it has been difficult to reduce the effective film thickness of the gate insulator.

From this perspective, in recent years, a method adopting a metal oxide such as HfSiON or the like, being a high-dielectric material, as a material for the gate insulator has been proposed. With such technique, the $SiO_2$ conversion thickness of the gate insulator (i.e. the effective film thickness of the gate insulator) can be reduced while keeping the actual physical film thickness of the gate insulator, whereby the device can be downsized while at the same time possible increase in the gate leakage current can be prevented.

Moreover, when the physical thickness of the gate insulator is less than 1 nm, it is difficult to achieve such FET where a polysilicon is used as a material for the gate electrode as in a case of a common FET. From this perspective, conventionally, a method with which the effective film thickness of the gate insulator can be thinned down while capacity decrease due to depletion in the electrode can be prevented at the same time by using a metal as a material for the gate electrode to be formed on the gate insulator has been proposed.

However, in a case where the metal film for gate electrode formation is formed directly on the gate insulator, there is a possibility that a surface of the gate insulator could be damaged through the metal film formation process, due to which deterioration in FET performance such as reliability decline with the gate insulator, mobility decline due to occurrence of fixed charges, and so forth, could occur.

BRIEF SUMMARY OF THE INVENTION

A semiconductor device comprises: a gate insulator formed on a substrate, the gate insulator including a high-dielectric film in whole or part; a reaction film including a first metal on the gate insulator; a metal film including a second metal on the reaction film, the second metal being made with a different composition from that of the first metal, and a thermal stability of the second metal being greater than that of the first metal; and a film including Si formed on the metal film.

A semiconductor device comprises: a gate insulator formed on a substrate, the gate insulator including a high-dielectric film in whole or part; a reaction film formed as a result of thermal reaction between at least a part of the high-dielectric film and a first metal; a metal film including a second metal on the reaction film, the second metal being made with a different composition from that of the first metal, and a thermal stability of the second metal being greater than that of the first metal; and a film including Si formed on the metal film.

BRIEF DESCRIPTION OF THE DRAWINGS

FIG. 2-1 is a schematic sectional view (Phase 1) showing one example of manufacturing processes in a method of manufacturing a semiconductor device according to the first embodiment of the present invention;

FIG. 2-2 is a schematic sectional view (Phase 2) showing one example of the manufacturing processes in the method of manufacturing a semiconductor device according to the first embodiment of the present invention;

FIG. 2-3 is a schematic sectional view (Phase 3) showing one example of the manufacturing processes in the method of manufacturing a semiconductor device according to the first embodiment of the present invention;

FIG. 2-4 is a schematic sectional view (Phase 4) showing one example of the manufacturing processes in the method of manufacturing a semiconductor device according to the first embodiment of the present invention;

FIG. 2-5 is a schematic sectional view (Phase 5) showing one example of the manufacturing processes in the method of manufacturing a semiconductor device according to the first embodiment of the present invention;

FIG. 2-6 is a schematic sectional view (Phase 6) showing one example of the manufacturing processes in the method of manufacturing a semiconductor device according to the first embodiment of the present invention;

FIG. 3 is a schematic sectional view showing an example of a structure of a gate electrode in a case where $Ta_2C$ is used as a material of a metal electrode and a thermal treatment is performed for 10 seconds under a temperature of 1000° C.;

FIG. 4 is a schematic sectional view showing an example of a structure of a gate electrode in a case where TaC is used as a material of a metal electrode and a thermal treatment is performed for 10 seconds under a temperature of 1000° C.;

FIG. 5 is a schematic sectional view showing an example of a structure of a gate electrode according to the first embodiment of the present invention;

FIG. 6 is a diagram showing results of analysis on a relationship between intensity of applied electric field and mobility with respect to a transistor using the $Ta_2C$ film shown in FIG. 3, a transistor using the TaC film shown in FIG. 4, and a transistor in the first embodiment of the present invention, respectively;

FIG. 8-1 is a schematic sectional view (Phase 1) showing one example of manufacturing processes in a method of manufacturing a semiconductor device according to the second embodiment of the present invention;

FIG. 8-2 is a schematic sectional view (Phase 2) showing one example of the manufacturing processes in the method of manufacturing a semiconductor device according to the second embodiment of the present invention;

FIG. 8-3 is a schematic sectional view (Phase 3) showing one example of the manufacturing processes in the method of manufacturing a semiconductor device according to the second embodiment of the present invention;

FIG. 8-4 is a schematic sectional view (Phase 4) showing one example of the manufacturing processes in the method of manufacturing a semiconductor device according to the second embodiment of the present invention; and FIG. 8-5 is a schematic sectional view (Phase 5) showing one example of the manufacturing processes in the method of manufacturing a semiconductor device according to the second embodiment of the present invention.

DETAILED DESCRIPTION OF THE INVENTION

Exemplary embodiments of a method of manufacturing a semiconductor device and a semiconductor device according to the present invention will be explained below in detail with reference to the accompanying drawings. The present invention is not limited to the following embodiments.

Figure 1:
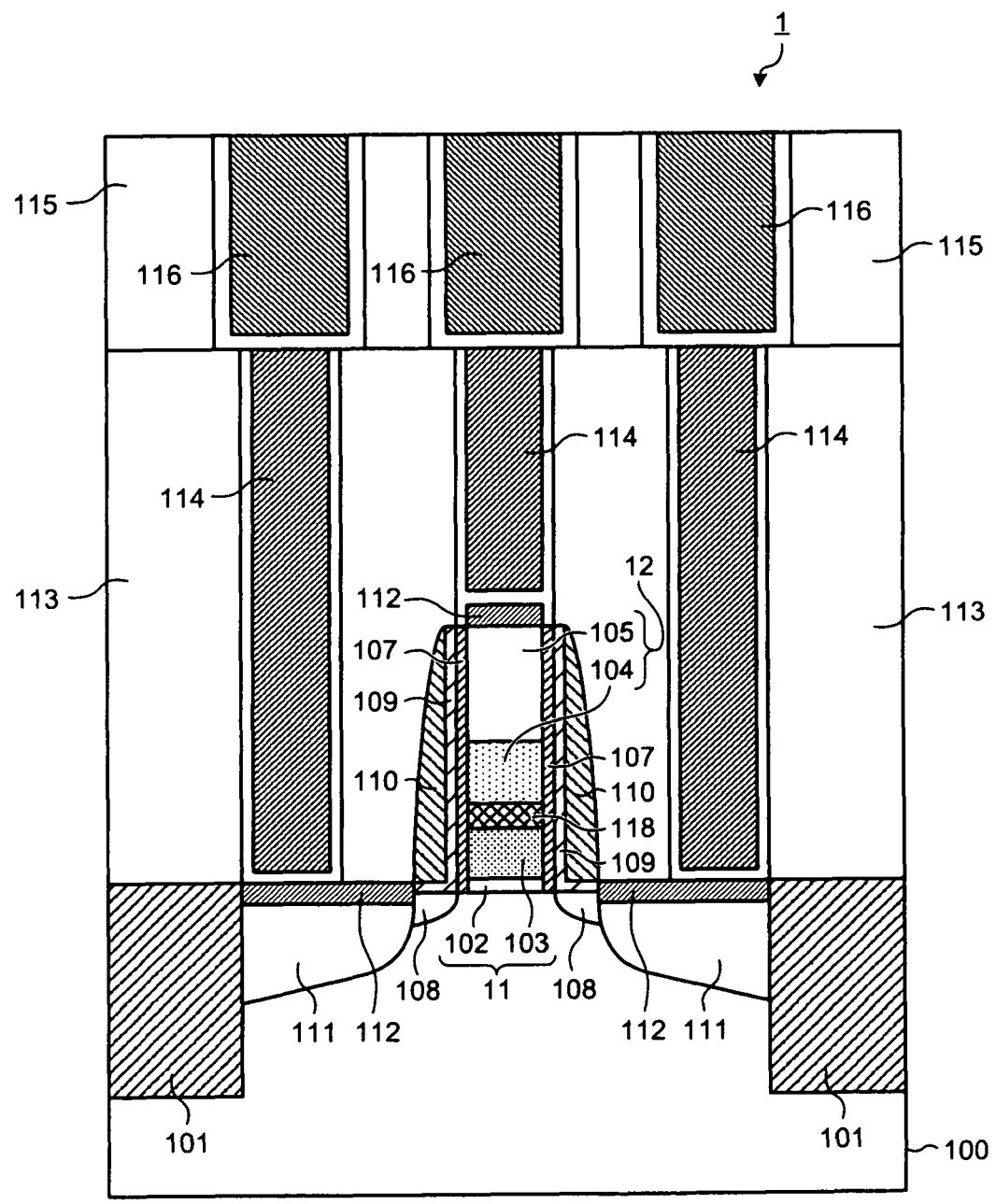
FIG. 1 is a schematic sectional view showing one example of a structure of a semiconductor device according to a first embodiment of the present invention.

Now, a method of manufacturing a semiconductor device according to a first embodiment of the present invention, and a structure of a semiconductor device manufactured with such manufacturing method will be described. FIG. 1 is a schematic sectional view showing one example of a structure of a semiconductor device 1 according to the first embodiment of the present invention.

The semiconductor device 1 shown in FIG. 1 has an n-type MIS (metal insulator semiconductor) transistor. An element face of a silicon (Si) substrate 100 in the semiconductor device 1 is divided into one or more active regions by field insulators being formed in field regions 101. The field regions 101 function to electrically separate the active regions of semiconductor elements formed in the Si substrate 100 from one another. The field insulator of the field region 101 can be formed by a STI (shallow trench isolation) method, for example. The n-type MIS transistor is formed at a p-type well formed as having a p-type dopant doped into the Si substrate 100. The p-type dopant is being doped into the Si substrate 100 for the purpose of threshold value adjustment in the MIS transistor.

As shown in FIG. 1, the n-type MIS transistor, in its electrode structure, has a $SiO_2$ film 102, a high-dielectric film 103 and a metal electrode 104 as being sequentially formed on the Si substrate 100 in that order; a polysilicon film 105 formed on the metal electrode 104; and a silicide film 112 formed on the polysilicon film 105. The $SiO_2$ film 102 and the high-dielectric film 103 on the Si substrate 100 function as a gate insulator 11. Meanwhile, the metal electrode 104 and the polysilicon film 105 on the gate insulator 11 function as a gate electrode 12. The silicide film 112 on the polysilicon film 105 functions as a low-resistance film that reduces contact resistance between the gate electrode 12 and a contact 114, which will be described later on. It is possible to have this silicide film 112 included in the gate electrode 12.

The n-type MIS transistor has sidewall films being formed on sides of the gate insulator 11 and the gate electrode 12, each sidewall film including a $SiO_2$ film 107, a silicon nitride film ($SiN_x$ film) 109 and a $SiO_2$ film 110. In the Si substrate 100 underneath each of the sidewall films, a lightly doped region 108 is formed as having an n-type dopant being shallowly diffused. Outside each of the lightly doped regions 108, a highly doped region 111 is formed as having an n-type dopant being deeply diffused. Silicide films 112 are formed on these doped regions. Moreover, the semiconductor device 1 has contact plugs 114 formed inside a first interlayer insulator 113, the contact plugs 114 serving to connect the silicide films 112 on the highly doped region 111 and the silicide film 112 on the gate electrode 12 with the wirings 116 formed inside a second interlayer insulator 115, respectively.

The high-dielectric film 103 is formed with a high-dielectric material having higher permittivity than a silicon oxide film ($SiO_2$ film) which has been selected and used as a material for the conventional gate insulator. Therefore, it is possible to thin down the $SiO_2$ conversion film thickness while at the same time thicken the actual physical thickness of the gate insulator, whereby possible increase in the gate leakage current can be prevented. The high-dielectric film 103, for instance, is formed with HfSiON, which is a hafnium system insulant being a high-dielectric material. The high-dielectric material to be used in the present embodiment can include such ferroelectric material as barium titanate ($BaTiO_3$), lead zirconate titanate ($Pb(Zr, Ti)O_3$) or the like, with which electric dipole can be formed even in a state without an external electric field.

The metal electrode 104 can be formed with tantalum carbide (TaC). By using this metal electrode 104, possible capacity decrease due to depletion in the electrode can be prevented. As a result, the effective film thickness of the gate insulator 11 can be thinned further down. For the purpose of preventing reaction between the polysilicon film 105 and the TaC, a barrier metal film such as a titanium nitride film (TiN film), for example, can be optionally arranged at an interface between the polysilicon film 105 and the metal electrode 104.

Furthermore, as shown in FIG. 1, the n-MIS transistor has a reaction film 118 being formed in between the high-dielectric film 103 and the metal electrode 104. The reaction film 118 is formed as a result of a thermal treatment reaction between a surface layer of the high-dielectric film 103 and a predetermined metal film, but not the metal film that forms the metal electrode 104, having been formed on the high-dielectric film 103. Here, if the metal film that forms the metal electrode 104 is to be referred to as a second metal film, the metal film having been formed on the high-dielectric film 103 separately from the second metal film that forms the metal electrode 104 can be referred to as a first metal film.

This reaction film 118 is formed for the purpose of compensating for damages that can be caused on the surface of the high-dielectric film 103 through the process of forming the first metal film. That is, by forming the reaction film 118, it is possible to reduce residual damages on the high-dielectric film 103. Accordingly, since the MIS type transistor shown in FIG. 1 is formed as including a high-dielectric film 103 with little damage, sufficient performance of the semiconductor device as well as reliability of the high-dielectric film 103 can be secured.

Now, with reference to FIG. 2-1 to FIG. 2-6, the method of manufacturing the semiconductor device having such high-dielectric film 103 with little damage will be described. FIG. 2-1 to FIG. 2-6 are schematic sectional views showing one example of manufacturing processes in the method of manufacturing the semiconductor device according to the present embodiment as shown in FIG. 1.

Figures 1, 2:
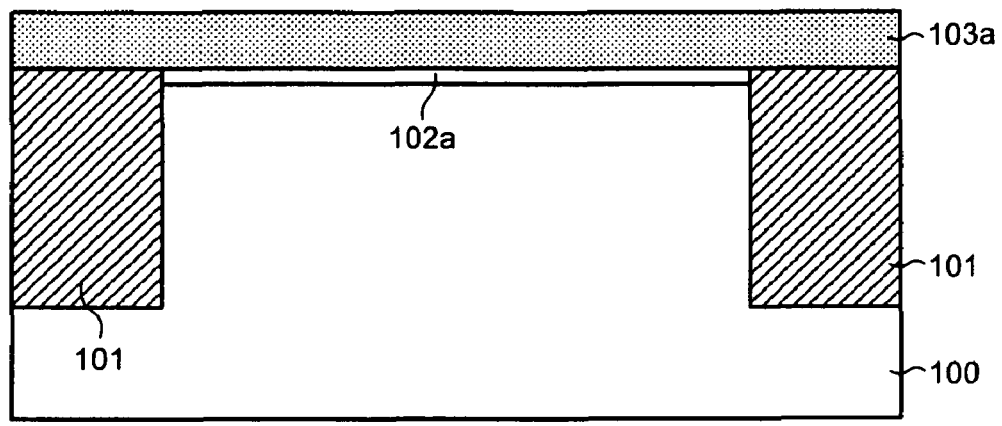
Figure 2:
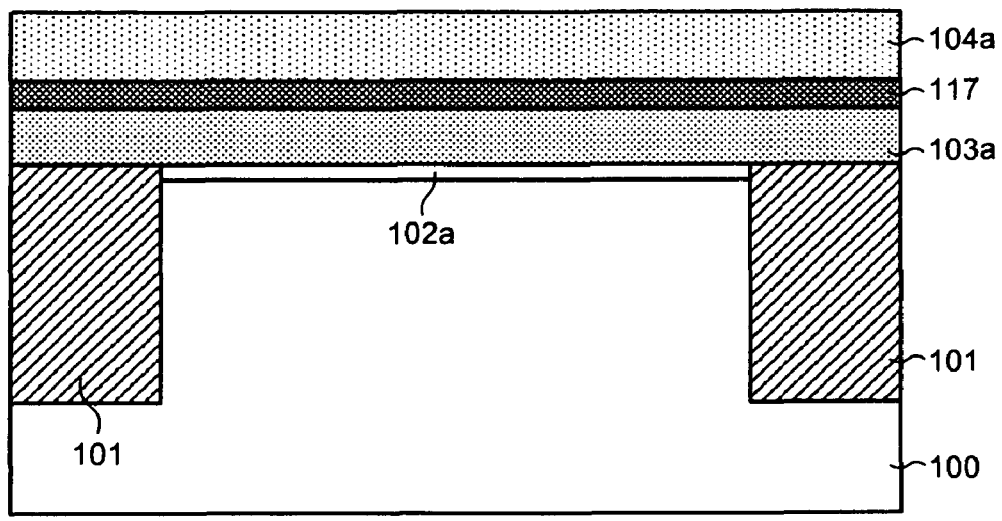

As shown in FIG. 2-1, the filed regions 101 having predetermined patterns are formed on a surface of a Si substrate 100 by a STI method, or the like. Specifically, for example, a buffer film, and an $SiN_x$ film to become a mask are formed sequentially on the Si substrate 100, after which the $SiN_x$ film, the buffer film and the Si substrate 100 are etched sequentially to a predetermined depth using a photolithography technique. Then, after removing a resist used in the photolithography, a $SiO_2$ film is formed on the entire element face of the Si substrate 100 in such a way that the trenches having been formed by the etching are plugged, after which a surface of the $SiO_2$ film is flattened by CMP (chemical mechanical polishing) or the like. Thereby, the field regions 101 that divide the element face of the Si substrate 100 into one or more active regions are formed. Then, after doping a p-type dopant into the Si substrate 100 to form a p-type well, a SiO$_2$ film 102a is formed on the entire surface of the Si substrate 100 to a thickness of about 0.8 nm, for example. After that, a hafnium system insulator 103a to be processed into the high-dielectric film 103 is formed on the Si substrate 100 by a CVD (chemical vapor deposition) method using one or more organic sources. The hafnium system insulator 103a can be a HfSiON film, HfO$_2$ film, HfSiO film, or the like. The hafnium system insulator 103a is formed to a thickness of about 2 nm, for example.

After that, as shown in FIG. 2-2, a first metal film 117 is formed on the hafnium system insulator 103a. The first metal film 117 is an ultrathin Ta film with a thickness of about 0.5 nm, for example. The first metal film 117 is formed by a sputtering method, for instance. Then, on this first metal film 117, a second metal film 104a of TaC material is formed. The TaC has a characteristic in that it has higher thermal stability than Ta$_2$C which is another kind of a tantalum carbide (Ta$_x$C). The second metal film 104a (i.e. the TaC film) is formed to a thickness of about 10 nm, for example. The second metal film 104a is formed by a sputtering method, for instance. Here, the second metal film 104a may include a TiN film formed on the TaC film to serve as a barrier metal film.

Figures 2, 3:
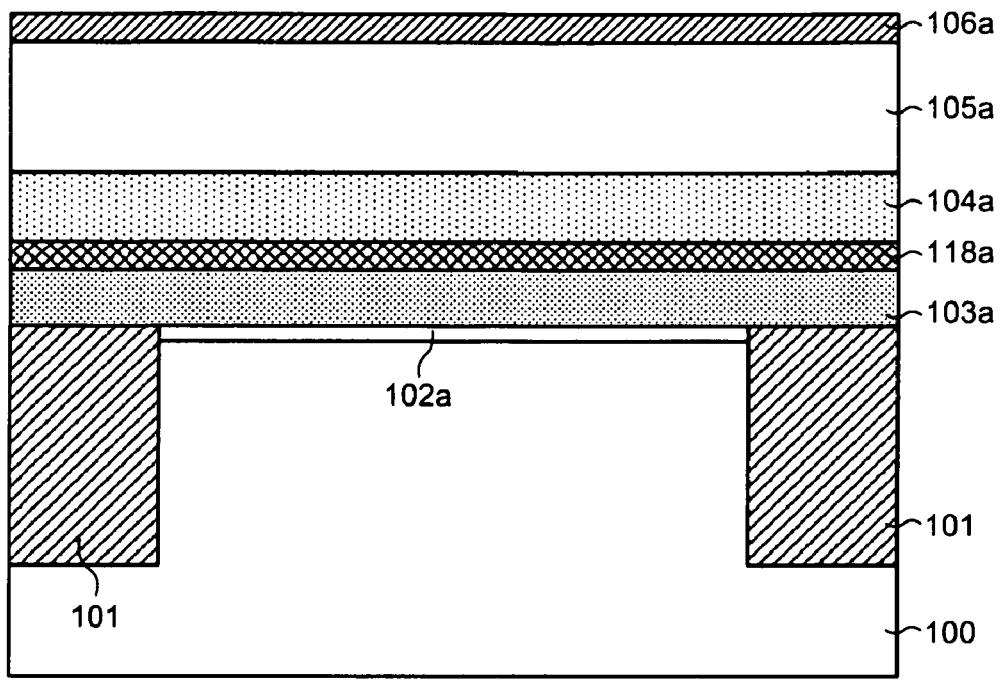

Then, a thermal treatment is performed for about 10 seconds under a temperature of 900° C. Thereby, as shown in FIG. 2-3, a reaction film 118a is formed in between the hafnium system insulator 103a and the first metal film 117 as a result of a thermal treatment reaction between the hafnium system insulator 103a and the first metal film 117. For example, in a case when a HfSiON film is formed as the hafnium system insulator 103a, the HfSiON film and the Ta being the constituent atom of the first metal film 117 react with each other to form a TaHfSiON film as the reaction film 118a. Specifically, this reaction film 118a is formed as a result of a thermal treatment reaction between the first metal insulator 117 and parts of the surface of the hafnium system insulator 103a underneath the first metal film 117 which have been electrostatically damaged by plasma generated while the first metal film 117 was formed by sputtering. Accordingly, by forming the reaction film 118a through the thermal treatment, it is possible to compensate for the electrostatically damaged parts of the surface of the hafnium system insulator 103a. As a result, it is possible to reduce residual damages in the hafnium system insulator 103a.

Then, as shown in FIG. 2-3, a polysilicon film 105a is formed on the whole surface of the second metal film 104a to a thickness of about 80 nm, for example. Then, after implanting P$^+$ ions into the polysilicon film 105a, a SiN$_x$ film 106a which is to function as a protection film on an upper part of the gate electrode 12 in a later etching process and etchback process is formed. A thickness of the SiN$_x$ film 106a is about 100 nm, for example.

Figures 2, 3, 4:
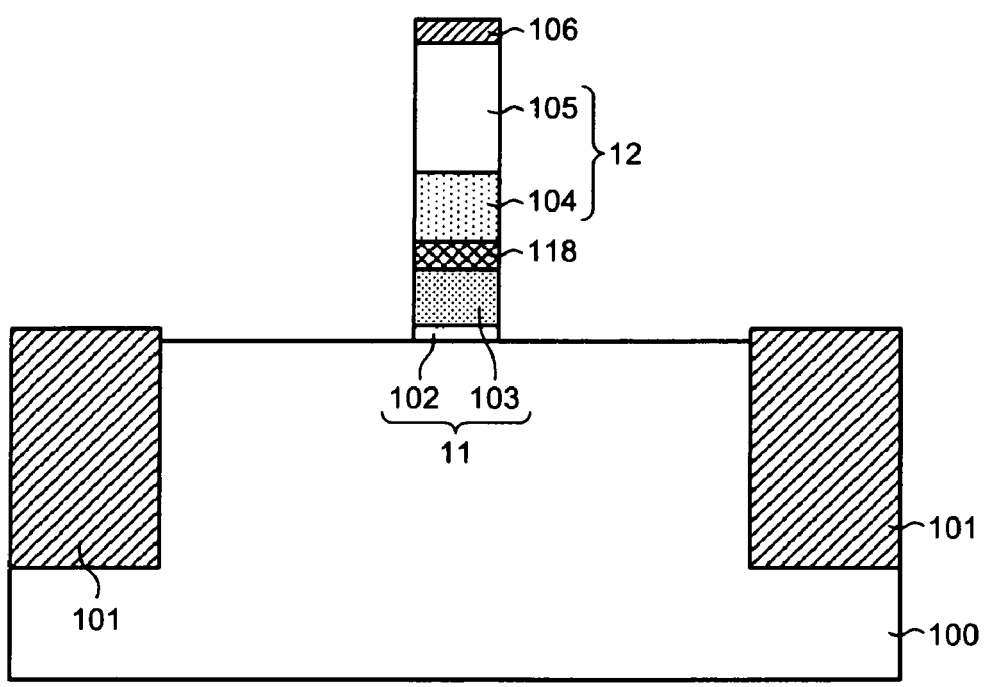

Then, photoresist is applied on the SiN$_x$ film 106a, and a resist pattern is formed above a gate electrode forming region through carrying out exposure and developing processes on the photoresist. Then, while using this resist pattern as a mask, the SiN$_x$ film 106a, the polysilicon film 105a, the second metal film 104a, the reaction film 118a, the hafnium system insulator 103a and the SiO$_2$ film 102a on a region other than the gate electrode forming region are sequentially etched. For example, the SiN$_x$ film 106a, the polysilicon film 105a, the second metal film 104a and the reaction film 118a are etched through anisotropic etching. Meanwhile, the hafnium system insulator 103a and the SiO$_2$ film 102a are etched, for example, through anisotropic etching, or wet etching using diluted Hf, for example. As a result, as shown in FIG. 2-4, the gate insulator 11 as including the SiO$_2$ film 102 and the high-dielectric film 103 is formed to a length of about 30 nm in a gate length direction, for example, and the gate electrode 12 as including the metal electrode 104 and the polysilicon film 105 is formed to a length of about 30 nm in a gate length direction, for example. The reaction film 118, if it has insulation ability, will function as a part of the gate insulator 11, or if it has conductivity, will function as a part of the gate electrode 12. The resist pattern used in the photolithography process is removed after the SiN$_x$ film 106a, the polysilicon film 105a, the second metal film 104a, the reaction film 118a, the hafnium system insulator 103a and the SiO$_2$ film 102a on a region other than the gate electrode forming region are etched. Meanwhile, on the polysilicon film 105, the SiN$_x$ film 106 to be functioning as a protection film remains. This SiN$_x$ film 106 having been remained is to function as a protection film also in a subsequent etching process.

Then, after forming the SiO$_2$ film on the whole element face of the Si substrate 100 using a CVD method, for instance, an etchback process is performed on this SiO$_2$ film. Thereby, as shown in FIG. 2-5, a structure where the sidewall portion of the gate electrode pattern is surrounded by the SiO$_2$ film 107 is obtained. Then, after implanting As$^+$ ions as a dopant, for example, into the Si substrate 100, a thermal treatment for crystal compensation is performed for five seconds under a temperature of 800° C., for example. Thereby, the lightly doped regions 108 are formed. Then, after forming a SiN$_x$ film and a SiO$_2$ film, these SiN$_x$ film and SiO$_2$ film are etched back. Thereby, as shown in FIG. 2-6, a sidewall film including the SiO$_2$ film 107, the SiN$_x$ film 109 and the SiO$_2$ film 110 is formed in the sidewall portion of the gate electrode pattern. In this etchback process, the SiN$_x$ film 106 which has been remained on the polysilicon film 105 in the gate electrode pattern is to be removed. Then, after implanting P$^+$ ions as a dopant, for example, a thermal treatment for activating the implanted dopant is performed for five seconds under a temperature of 1030° C., for example. Thereby, the highly doped regions 111 are formed. Then, a nickel (Ni) film is formed to a thickness of about 10 nm, for example. After that, the Ni in the nickel film is made to react with the Si in the Si substrate 100 and the surface of the polysilicon film 105 in the top layer of the gate electrode pattern, by performing a thermal treatment for about 30 seconds under a temperature of 350° C. The unreacted parts of the Ni film are to be removed using a mixed solution of sulfuric acid and hydrogen peroxide solution, for example. Then, by performing a thermal treatment for about 30 seconds under a temperature of 500° C., the silicide films 112 are formed on the gate electrode 12 as well as the highly doped regions 111.

After that, the first interlayer insulator 113 as shown in FIG. 1 is formed on the entire element face of the Si substrate 100, and then desired contact holes are formed on the first interlayer insulator 113. Then, by having a titanium (Ti)—TiN-tungsten (W) film embedded inside these contact holes, and then removing the Ti—TiN—W film on the upper surface of the first interlayer insulator 113 by planarizing the film through a CMP method, for example, the contact plugs 114 as shown in FIG. 1 are formed. After that, the second interlayer insulator 115 as shown in FIG. 1 is formed on the entire element face of the Si substrate 100, and then desired trenches are formed in the second interlayer insulator 115. Then, by having tantalum nitride (TaN)-copper (Cu) film embedded inside these trenches, and then removing the TaN—Cu film on the upper surface of the second interlayer insulator 115 by planarizing the film through a CMP method, the wirings 116 that electrically connect the contact plugs 114 are formed. Thereby, the semiconductor device 1 as shown in FIG. 1 is obtained.

As described above, in the first embodiment, the ultrathin Ta film as the first metal film 117 is formed, through sputtering, in between the hafnium system insulator 103a to be processed into the high-dielectric film 103 and the second metal film 104a to be processed into the metal electrode 104, after which the first metal film 117 and the hafnium system insulator 103a are made to react by the thermal treatment to form the reaction film 118a (i.e. the reaction film 118).

The metal film that forms the metal electrode on the gate insulator is formed by sputtering, for example. Here, in terms of $Ta_xC$ as a material for the metal electrode, a case where $Ta_2C$ having low thermal stability but high reactivity is used as the material for the metal electrode, and a case where TaC having high thermal stability but low reactivity is used as the material for the metal electrode will be described in detail with reference to the drawings.

FIG. 3 is a schematic sectional view of a gate electrode in a case where $Ta_2C$ is used as the material for the metal electrode and a thermal treatment is performed for 10 seconds under a temperature of 1000° C. FIG. 4 is a schematic sectional view of a gate electrode in a case where TaC is used as the material for the metal electrode and a thermal treatment is performed for 10 seconds under a temperature of 1000° C.

As shown in FIG. 3, in a case where a $Ta_2C$ film 303 was formed on the hafnium system insulator 301 as a metal film forming the metal electrode, a reaction film 302 as a result of reaction between $Ta_2C$ and a hafnium system insulant was formed in between the $Ta_2C$ film 303 and the hafnium system insulator 301 through a thermal treatment performed for 10 seconds under a temperature of 1000° C. In this case, for example, if a HfSiON film was formed as the hafnium system insulator 301, a TaHfSiON film would be formed locally as the reaction film 302. This is because the $Ta_2C$ film 303 had lower thermal stability, and thus the lower surface of the $Ta_2C$ film 303 and the surface of the hafnium system insulator 301 contacting the lower surface of the $Ta_2C$ film 303 reacted through various thermal treatments as performed after the formation of the $Ta_2C$ film.

On the other hand, as shown in FIG. 4, in a case where a TaC film 304 was formed on the hafnium system insulator 301 as a metal film forming the metal electrode, a reaction film as a result of reaction between TaC and a hafnium system insulant was not formed in between the TaC film 304 and the hafnium insulator 301 even with a thermal treatment performed for 10 seconds under a temperature of 1000° C. This is because the TaC film 304 had enough thermal stability to not react with the hafnium system insulator 301 even through various thermal treatments as performed after the formation of the TaC film.

In a normal structure, when the metal film that forms the metal electrode and the gate insulator react with each other, a reaction film as a result of the reaction between the gate insulator and the metal film will be formed locally. Moreover, due to such reaction, some of the metal film to be functioning as the metal electrode will be expended in the formation of the reaction film. For this reason, it can be considered that when $Ta_2C$ is used as the material for the metal electrode, mobility decline in the transistor would be caused by decrease in electrode capacitance. For example, if the $Ta_2C$ film 303 shown in FIG. 3, in between which and the hafnium system insulator 301 the a reaction film 302 is formed, is used as the metal electrode, it can be predicted that the transistor characteristics could deteriorate more than in the case where the TaC film 304 shown in FIG. 4 is used as the metal electrode.

Here, mobility was measured for the case of the transistor in which the $Ta_2C$ film 303 shown in FIG. 3 was used, and for the case of the transistor where the TaC film 304 shown in FIG. 4 was used. FIG. 6 is a diagram showing a relationship between intensity of applied electric field and mobility with respect to each of the transistors in which the $Ta_2C$ film 303 shown in FIG. 3 was used, and in which the TaC film 304 shown in FIG. 4 was used. A curve 12 shown in FIG. 6 corresponds to a mobility characteristic of the transistor where the $Ta_2C$ film 303 shown in FIG. 3 was used, and a curve 13 shown in FIG. 6 corresponds to a mobility characteristic of the transistor where the TaC film 304 shown in FIG. 4 was used. As can bee seen from the curves 12 and 13 shown in FIG. 6, contrary to the above prediction that the transistor characteristics should deteriorate more in the case of the transistor with the $Ta_2C$ film 303 shown in FIG. 3, in effect the transistor with the $Ta_2C$ film 303 exhibited better mobility than the transistor with the TaC film 304 shown in FIG. 4.

The $Ta_2C$ film 303 or the TaC film 304 that forms the metal electrode is formed directly above the hafnium system insulator 301 using a sputtering method. A sputtering method is a method of forming a thin film on a surface of a substrate by first letting a target electrode discharge to generate a plasma state in a gas phase near a target surface, then generating direct-current electric charges between ions in the plasma and the target, and then letting the positive ions accelerated by this electric field collide with the target surface so that atoms discharged from the target surface through this collision are adhered to or deposited on the surface of the substrate having been arranged as facing the target. Thus, since plasma is used for film formation in the sputtering method, in a case of forming the metal film on the surface of the hafnium system insulator 301 using such sputtering method, electrostatic damage can be caused in the hafnium system insulator 301 by the plasma. That is, in the case of forming the metal film that forms the metal electrode on the gate insulator by using the sputtering method, damage can be caused on the surface of the gate insulator through the metal film formation process.

Therefore, the result shown in FIG. 6 proving that the transistor with the $Ta_2C$ film 303 shown in FIG. 3, with which deterioration of the transistor characteristics has been predicted, would exhibit better mobility than the transistor with the TaC film 304 shown in FIG. 4, indicates that the electrostatically damaged parts of the surface of the hafnium system insulator 301 were compensated while reacting with the highly reactive $Ta_2C$ film 303 in the thermal treatment performed for 10 seconds under a temperature of 1000° C. as a result of which the reaction film 302 was formed. That is, the result showing that the transistor with the $Ta_2C$ film 303 shown in FIG. 3 would exhibit better mobility, in terms of the transistor characteristic, than the transistor with the TaC film 304 shown in FIG. 4 indicates that the electrostatically damaged parts of the surface of the hafnium system insulator 301 had been compensated due to reacting with the Ta2c film 303 in the thermal treatment, and thus the residual damages in the hafnium system insulator 301 were reduced. Meanwhile, the result showing that the transistor with the less reactive TaC film 304 shown in FIG. 4 would exhibit less mobility, in terms of the transistor characteristic, than the $Ta_2C$ film 303 shown in FIG. 3, with which deterioration of the transistor characteristics has been predicted, indicates that the electrostatically damaged parts of the surface of the hafnium system insulator 301 remained due to not reacting with the TaC film 304 in the thermal treatment.

However, in the case where the gate electrode is formed using the highly reactive $Ta_2C$ film 303, because of the various thermal treatments performed for the purpose of activating the dopant, and the like, the reaction can progress locally even at an interface between the $Ta_2C$ film 303 and the polysilicon film 105 formed above the $Ta_2C$ film 303, as shown in FIG. 3. As a result, there may be a case in which a reaction film 305 is formed as a reaction result between the $Ta_2C$ film 303 and the polysilicon film 105. That is, since the $Ta_2C$ film 303 is less in thermal stability while highly reactive, it is difficult to control its reaction with the polysilicon film 105 in the upper layer. Therefore, because of not being able to let the $Ta_2C$ film 303 function as a barrier film with respect to the polysilicon film 105, there has been a case in that the function of the gate electrode itself was disturbed.

Figures 2, 3, 4, 5:
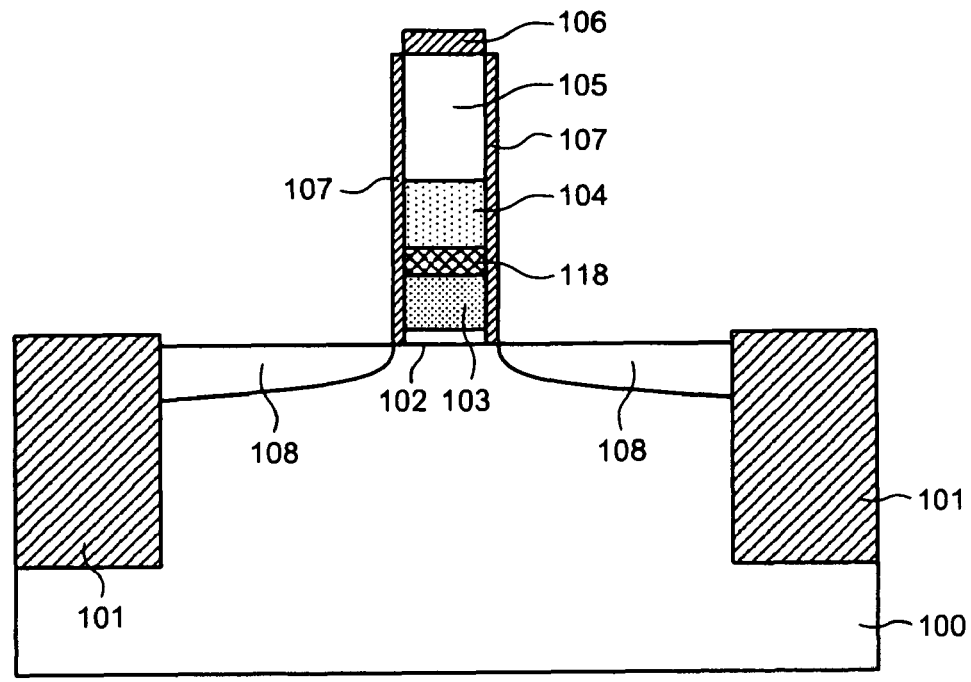
Figures 2, 3, 4, 5, 6:
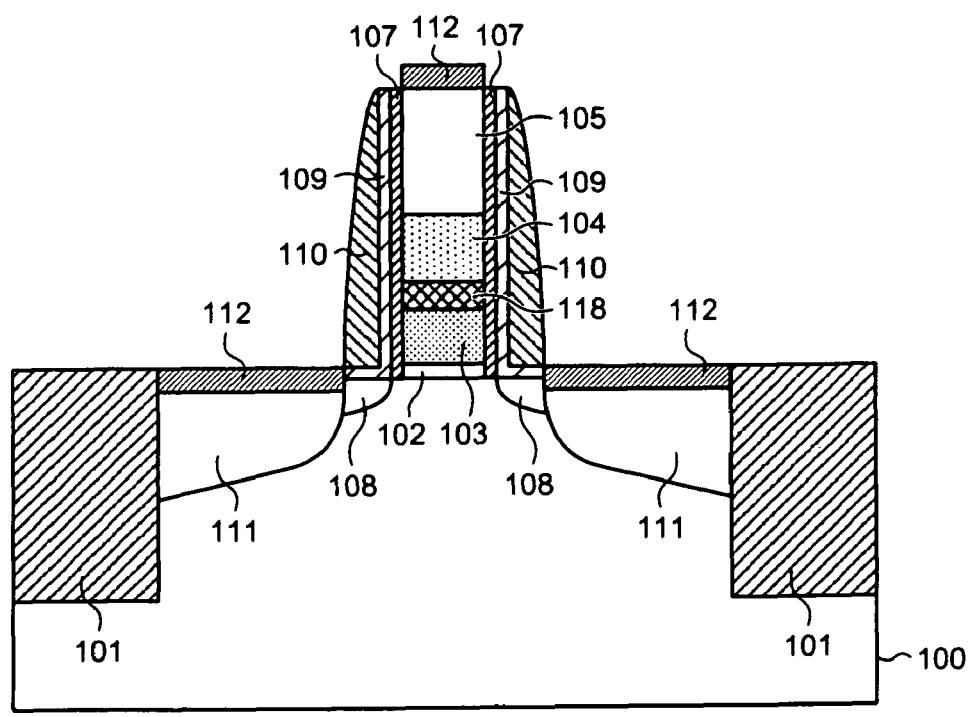
Figure 3:
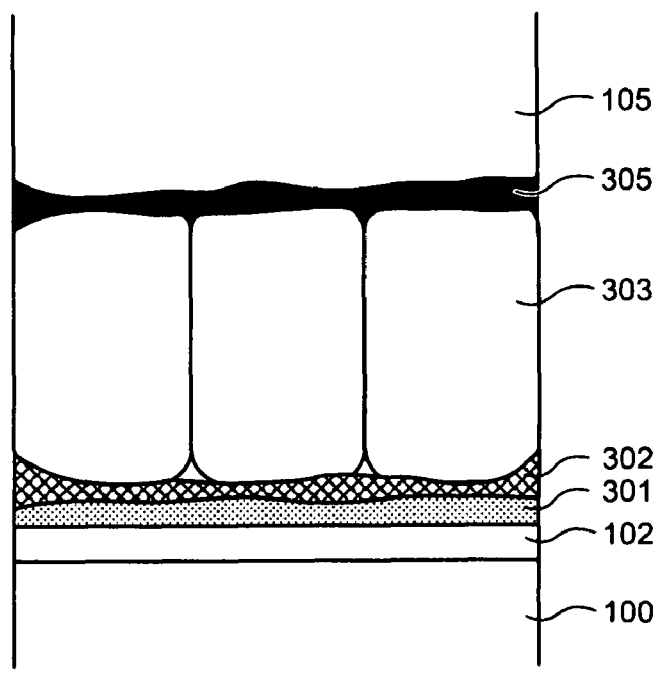
Figure 4:
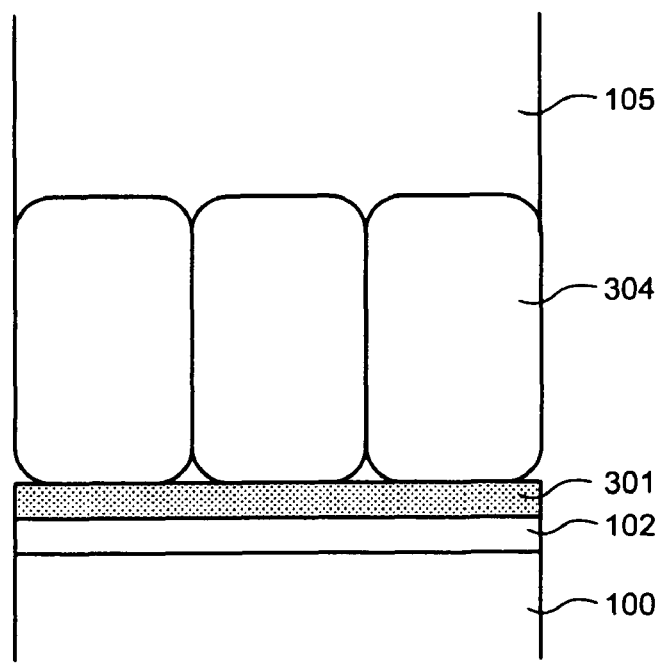
Figure 5:
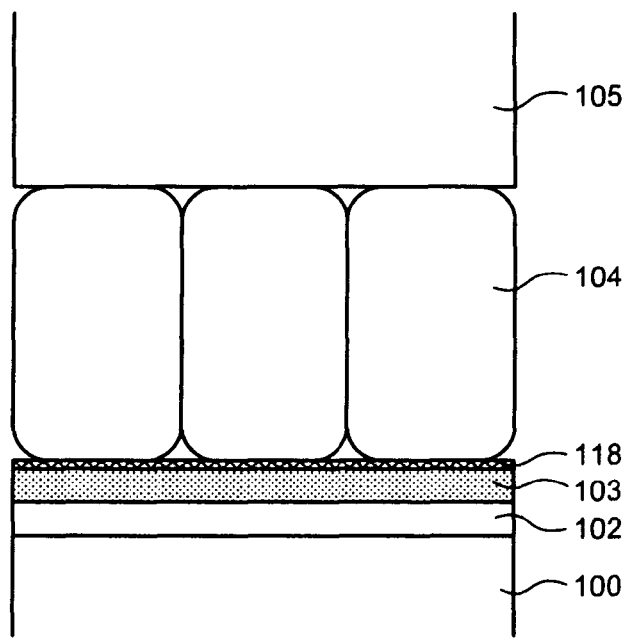
Figure 6:
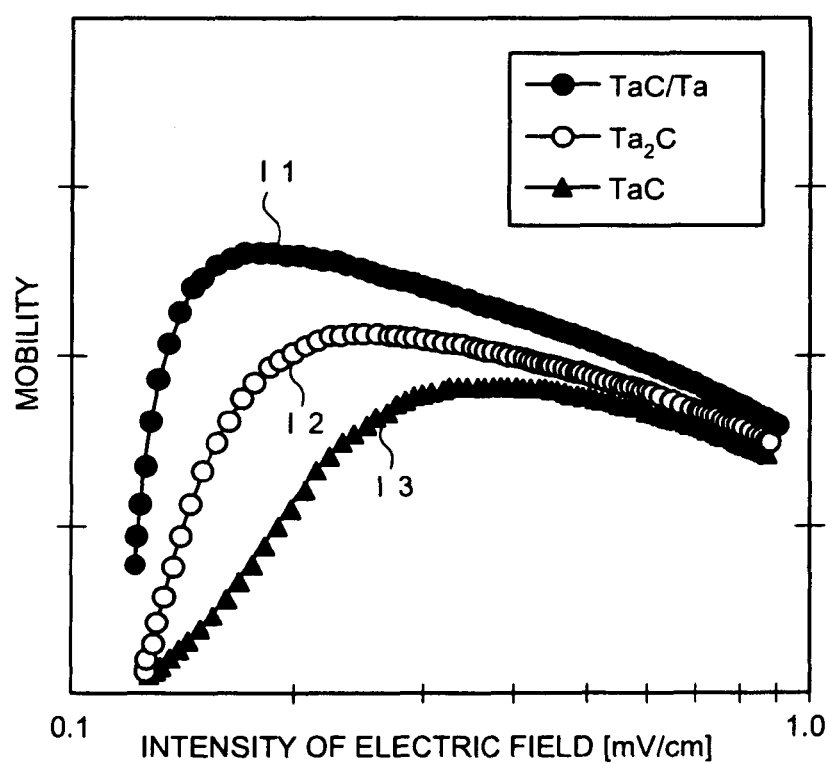

On the contrary, in the first embodiment, as shown in FIG. 5, the first metal film 117 (e.g. a highly reactive Ta film) is formed on the hafnium system insulator that forms the high-dielectric film 103, as separately from the TaC film that forms the metal electrode 104 and for the purpose of being reacted with the high-dielectric film 103, and then the reaction film 118 is formed by letting the surface of the hafnium system insulator and the first metal film 117 react with each other through the thermal treatment. That is, through the thermal treatment, the damaged parts on the surface of the hafnium system insulator react with the highly reactive Ta film to form the reaction film 302 with which the damaged parts on the surface of the hafnium system insulator can be compensated. In other words, with the semiconductor device 1, reliability of the gate insulator can be secured by having the damaged parts of the gate insulator compensated by the formation of the reaction film 118.

Moreover, in the first embodiment, as shown in FIG. 5, since the TaC film with high thermal stability is formed in between the polysilicon film 105 and the first metal film, it is possible to prevent reaction from happening at the interface between the polysilicon film 105 and the metal electrode 104 formed with the TaC film. In other words, in the first embodiment, since TaC with high thermal stability is used as a constituent material for the metal electrode 104, it is possible to let the metal electrode 104 function as a barrier film with respect to the polysilicon film 105. Furthermore, by using the TaC as the constituent material for the metal electrode 104, the reaction between the metal electrode 104 and the polysilicon film 105 in the upper layer can be accurately controlled. In addition, by using the TaC as the constituent material for the metal electrode 104, it is possible to prevent the metal film to be functioning as the metal electrode from being expended in the reaction with the gate insulator. As a result, according to the present embodiment, it will be possible to maintain the function of the gate electrode at a normal condition.

As described above, the transistor of the semiconductor device 1 according to the first embodiment is capable of achieving better transistor characteristics than the transistor shown in FIG. 3 that adopts the $Ta_2C$ film 303 or the transistor shown in FIG. 4 that adopts the TaC film 304. An actual result derived from an analysis on a relationship between applied electric field and mobility with respect to the transistor according to the present embodiment is shown by a curve 11 in FIG. 6. As shown by the curve 11, the transistor of the semiconductor device 1 was able to achieve far better mobility than the transistor with the metal electrode being formed only with the $Ta_2C$ film or the TaC film (cf. FIG. 3 or FIG. 4). This result indicates that in the semiconductor device 1 according to the first embodiment, reliability of the gate insulator was improved by having the damaged parts of the gate insulator compensated through the formation of the reaction film 118, and the gate electrode function was able to be secured appropriately by using the metal film with high thermal stability as the metal electrode.

In this way, with the method of manufacturing a semiconductor device according to the first embodiment, the damage on the surface of the gate insulator caused by the formation of the metal film can be compensated by letting the metal film formed on the high-dielectric film 103 as separately from the metal film that forms the metal electrode 104 react with the surface layer of the high-dielectric film 103 through the thermal treatment. Therefore, the semiconductor device 1 can be manufactured as having reliability of the gate insulator and operability thereof being secured.

Second Embodiment

Figure 7:
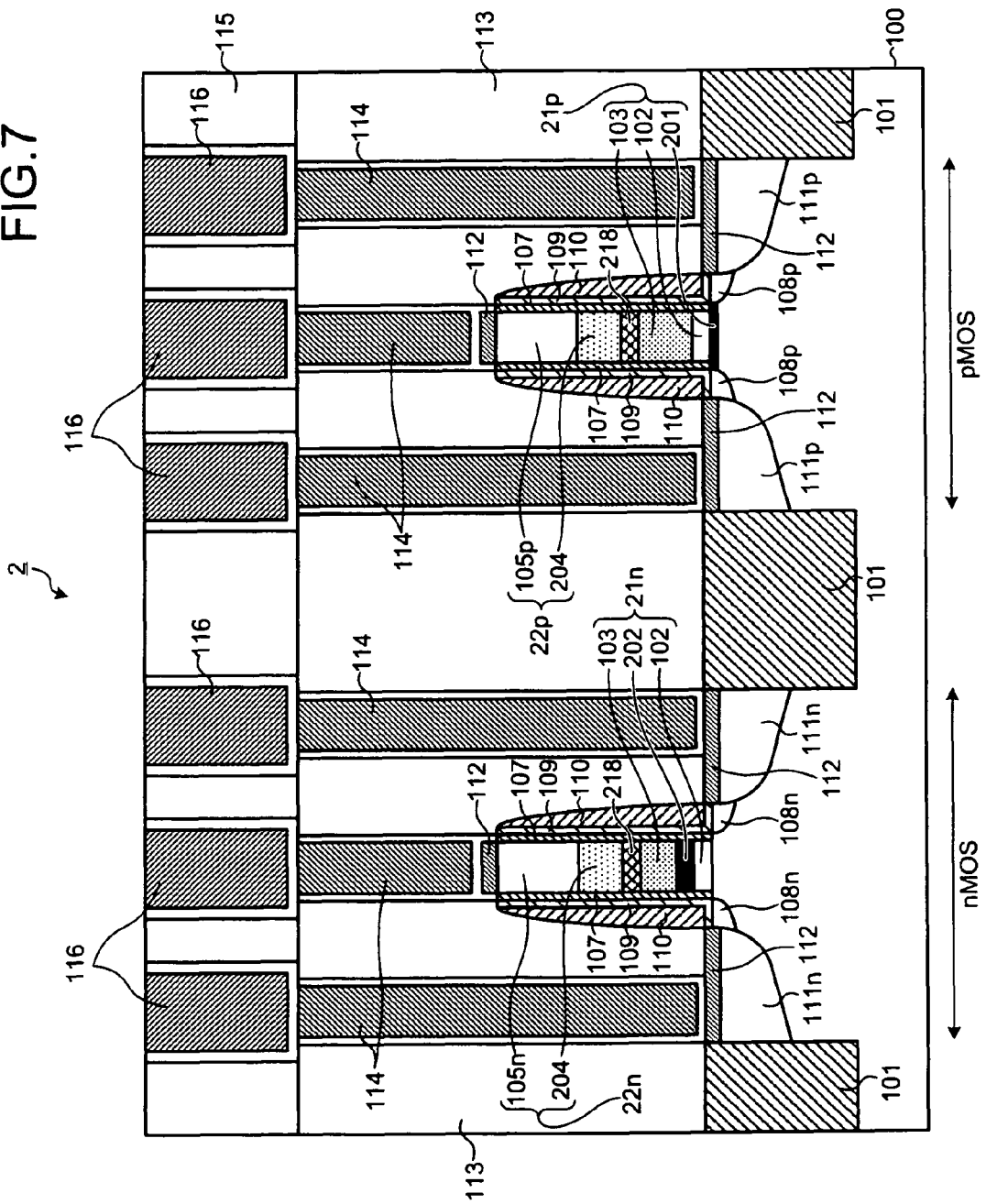
FIG. 7 is a schematic sectional view showing one example of a structure of a semiconductor device according to a second embodiment of the present invention.

Now, a second embodiment will be described. FIG. 7 is a schematic sectional view showing one example of a structure of a semiconductor device according to the second embodiment. In the following description of the second embodiment, a semiconductor device 2 will be described. As shown in FIG. 7, the semiconductor device 2 has a CMOS structure where an n-MOSFET and a p-MOSFET are formed in a pair. In the following description, the same reference numerals as used in the above-described first embodiment will be used in referring to structure members similar to those in the first embodiment, and redundant descriptions with respect to such similar structure members will be omitted herein.

As shown in FIG. 7, a Si substrate 100 includes an n-MOS region and a p-MOS region. The n-MOSFET is formed at the n-MOS region and the p-MOSFET is formed at the p-MOS region.

The n-MOSFET is formed at a p-type well formed as having a p-type dopant doped into a Si substrate 100. The n-MOSFET, in its electrode structure, has a $SiO_2$ film 102, a threshold adjusting film 202, a high-dielectric film 103, a metal electrode 204 and a polysilicon film 105n as being sequentially formed on the Si substrate 100 in that order; and a silicide film 112 formed on the polysilicon film 105n. The threshold adjusting film 202 is a film for controlling operational threshold values of the n-MOSFET, and it is formed with a $La_2O_3$ film, for example. The metal electrode 204 is formed with a TiN film, for example. The $SiO_2$ film 102, the threshold adjusting film 202 and the high-dielectric film 103 on the Si substrate 100 function as a gate insulator 21n. Meanwhile, the metal electrode 204 and the polysilicon film 105n on the gate insulator 21n function as a gate electrode 22n. It is possible to have the silicide film 112 included in the gate electrode 22n.

The n-MOSFET has sidewall films being formed on sides of the gate insulator 21n and the gate electrode 22n, each sidewall film including a $SiO_2$ film 107, a $SiN_x$ film 109 and a $SiO_2$ film 110. In the Si substrate 100 underneath each of the sidewall films, a lightly doped region 108n is formed as having an n-type dopant being shallowly diffused. Outside each of the lightly doped regions 108n, a highly doped region 111n is formed as having an n-type dopant being deeply diffused. Silicide films 112 are formed on these doped regions.

Furthermore, as shown in FIG. 7, the n-MOSFET has a reaction film 218 being formed in between the high-dielectric film 103 and the metal electrode 204. The reaction film 118 is formed as a result of a thermal treatment reaction between a surface layer of the high-dielectric film 103 and a Ti film having been formed on the high-dielectric film 103 separately from the TiN film that forms the metal electrode 204. Similarly to the reaction film 118 in the first embodiment, this reaction film 218 is formed for the purpose of compensating for damages that can be caused on the surface of the high-dielectric film 103 through the process of forming the Ti film being a first metal film. For example, in a case when a HfSiON film is formed as the hafnium system insulator 103a, a TiHfSiON film will be formed as the reaction film 218 as a result of a reaction between the HfSiON film and the Ti film.

The p-MOSFET is formed at an n-type well formed as having an n-type dopant doped into the Si substrate 100. The p-MOSFET, in its electrode structure, has a threshold adjusting film 201 formed on the surface of the Si substrate 100; a $SiO_2$ film 102, a high-dielectric film 103, a metal electrode 204 and a polysilicon film 105p as being sequentially formed on the threshold adjusting film 201 in that order; and a silicide film 112 formed on the polysilicon film 105p. The threshold adjusting film 201 is a film for controlling operational threshold values of the p-MOSFET, and it is formed with a SiGe film, for example. The metal electrode 204 is formed with a TiN film, for example. The threshold adjusting film 201 on a surface layer of the Si substrate 100, and the $SiO_2$ film 102 and the high-dielectric film 103 on the threshold adjusting film 201 function as a gate insulator 21p. Meanwhile, the metal electrode 204 and the polysilicon film 105p on the gate insulator 21p function as a gate electrode 22p. It is possible to have the silicide film 112 included in the gate electrode 22p.

Similarly to n-MOSFET, the p-MOSFET has sidewall films being formed on sides of the gate insulator 21p and the gate electrode 22p, each sidewall film including a $SiO_2$ film 107, a $SiN_x$ film 109 and a $SiO_2$ film 110. In the Si substrate 100 underneath each of the sidewall films, a lightly doped region 108p is formed as having a p-type dopant being shallowly diffused. Outside each of the lightly doped regions 108p, a highly doped region 111p is formed as having a p-type dopant being deeply diffused. Silicide films 112 are formed on these doped regions.

Moreover, as shown in FIG. 7, similarly to the n-MOSFET, the p-MOSFET has a reaction film 218 being formed in between the high-dielectric film 103 and the metal electrode 204. The reaction film 118 is formed as a result of a thermal treatment reaction between a surface layer of the high-dielectric film 103 and a Ti film having been formed on the high-dielectric film 103 separately from the TiN film that forms the metal electrode 204.

The semiconductor device 2, like the semiconductor device 1 shown in FIG. 1, has contact plugs 114 formed inside a first interlayer insulator 113, the contact plugs 114 serving to connect the silicide films 112 on the highly doped regions 111n and 111p, and the silicide films 112 on the gate electrodes 22n and 22p with the wirings 116 formed inside a second interlayer insulator 115, respectively.

Thus, in the semiconductor device 2 according to the second embodiment, the TiN film is used as the second metal film while the Ti film formed with Ti as being one of the constituent elements of the TiN film being the second metal film is used as the first metal film with which the reaction film 218 is formed. Similarly to the reaction film 118 in the first embodiment, this reaction film 218 is formed for the purpose of compensating for damages that can be caused on the surface of the high-dielectric film 103 through the process of forming the first metal film. That is, by forming the reaction film 218, it is possible to reduce residual damages in the high-dielectric film 103. In other words, in the semiconductor device 2 shown in FIG. 7, since each of the n-MOSFET and the p-MOSFET is formed as including the high-dielectric film 103 with little damage, sufficient performance of the semiconductor device as well as reliability of the gate insulator can be secured.

Figures 1, 8:
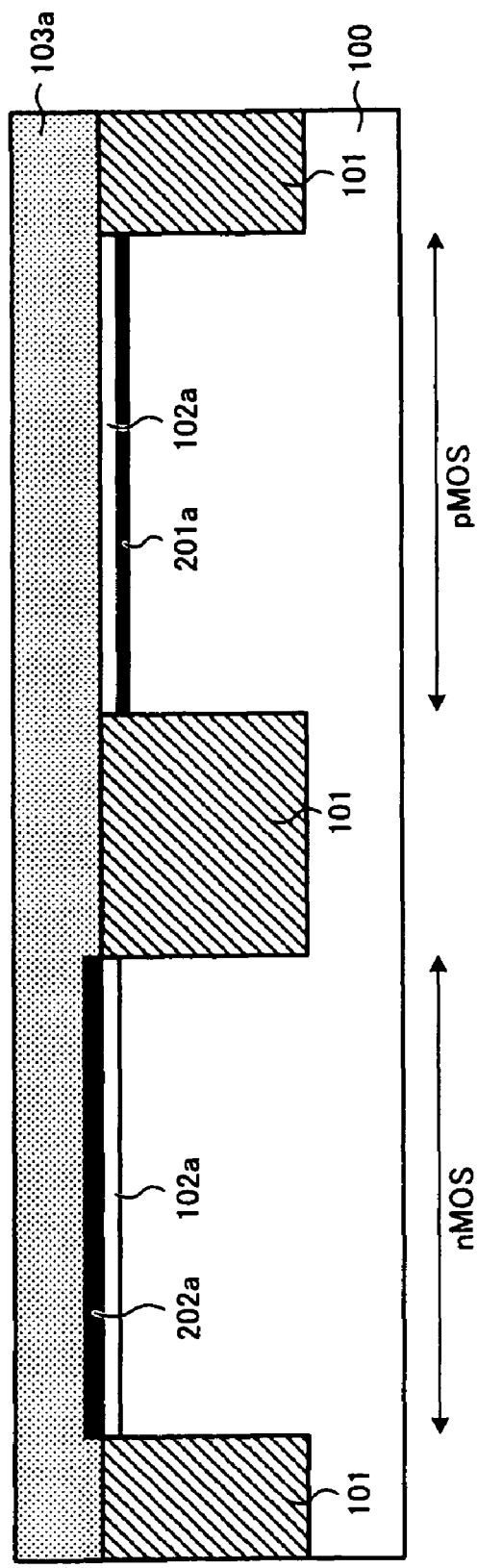
Figures 2, 8:
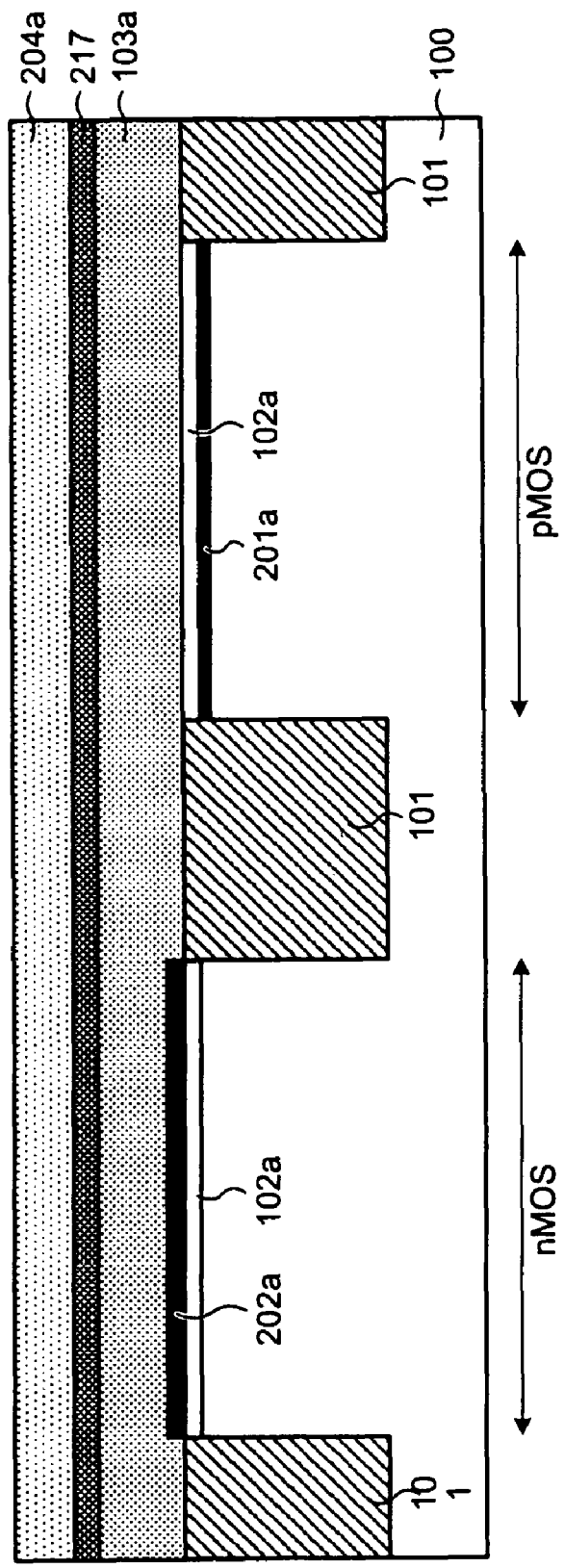
Figures 3, 8:
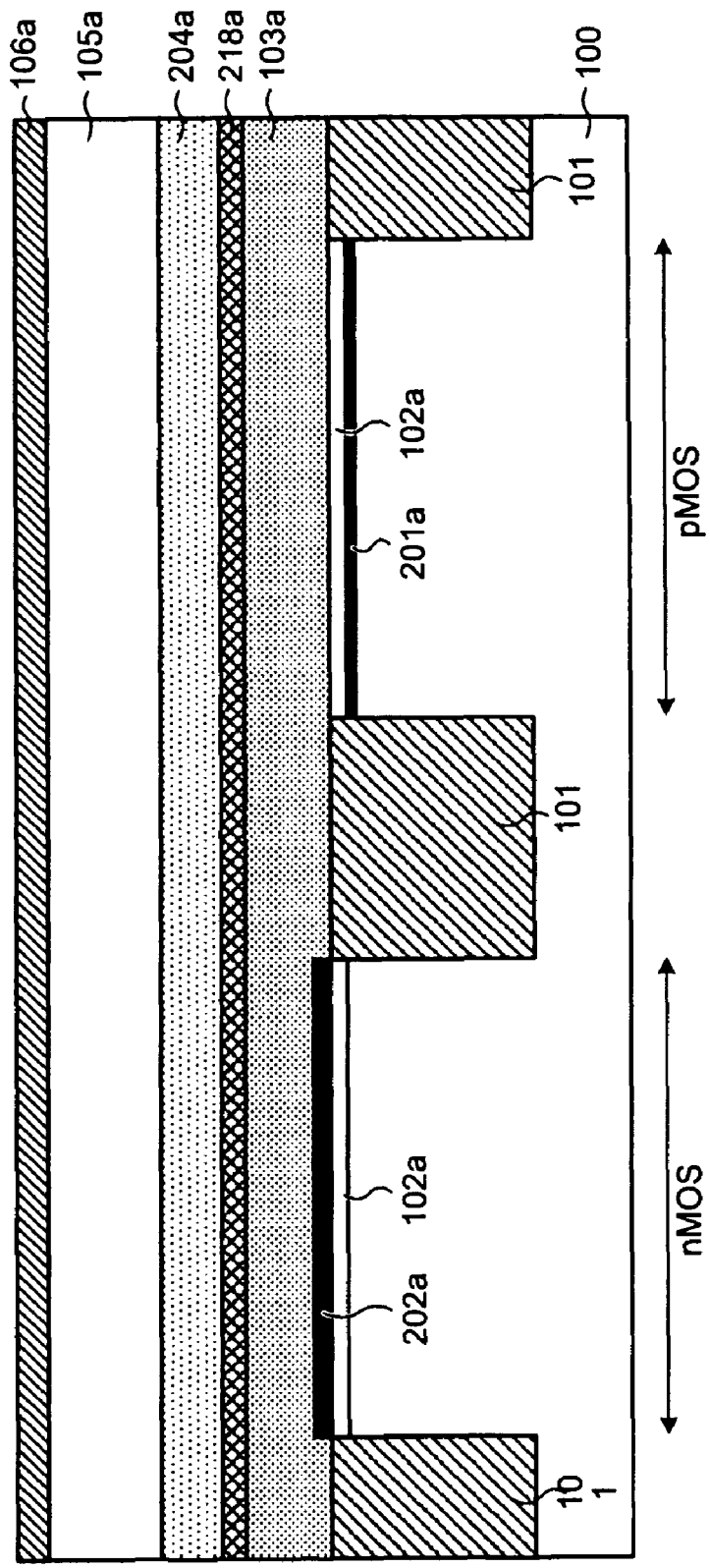
Figures 4, 8:
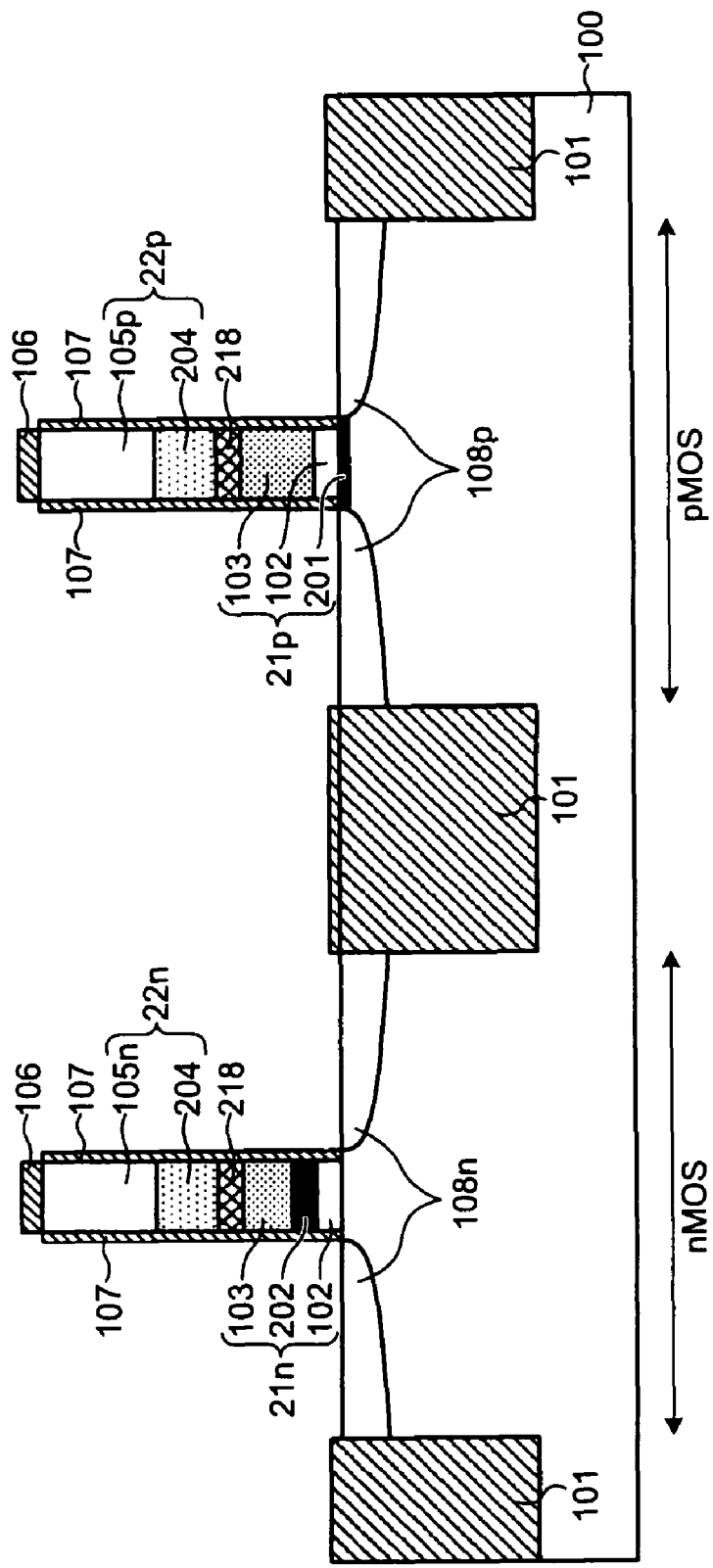
Figures 5, 8:
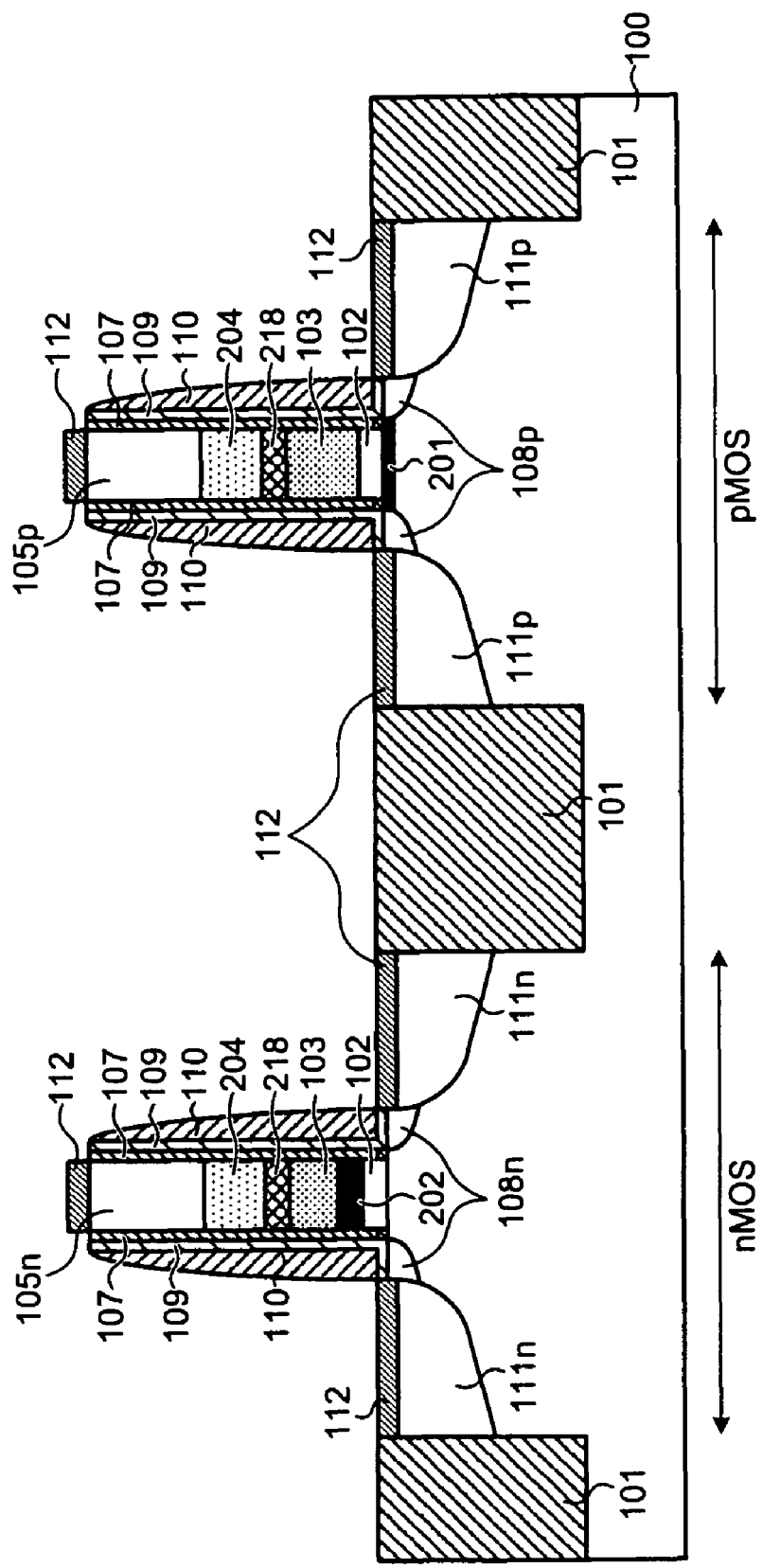

Now, with reference to FIG. 8-1 to FIG. 8-5, a method of manufacturing the semiconductor device 2 shown in FIG. 7 will be described. FIG. 8-1 to FIG. 8-5 are schematic sectional views showing one example of manufacturing processes in the method of manufacturing the semiconductor device according to the present embodiment as shown in FIG. 7.

First, as in the case of the first embodiment, the field regions 101 are formed as shown in FIG. 8-1. Then, after a p-type well is formed by doping a p-type dopant into the Si substrate 100 in the n-MOS region, and an n-type well is formed by doping an n-type dopant into the Si substrate 100 in the p-MOS region, a SiGe film 201a to be processed into the threshold adjusting film 201 is formed on a surface of the Si substrate 100 in the p-MOS region. A thickness of the threshold adjusting film 201 can be about 10 nm, for example. Then, after a $SiO_2$ film 102a is formed on the entire surface of the Si substrate 100 to a thickness of about 0.8 nm, for example, a $La_2O_3$ film 202a to be processed into the threshold adjusting film 202 is formed on the Si substrate in the n-MOS region. A thickness of the threshold adjusting film 202 can be about 0.3 nm, for example. Then, as in the case of the first embodiment, a hafnium system insulator 103a to be processed into the high-dielectric film 103 is formed on the Si substrate 100 by a CVD method using one or more organic sources.

After that, as shown in FIG. 8-2, a first metal film 217 is formed on the hafnium system insulator 103a. The first metal film 217 is an ultrathin Ti film with a thickness of about 0.3 nm, for example. This first metal film 217 is formed using a sputtering method, for example. Then, on this first metal film 217, a second metal film 204a of TiN material with high thermal stability is formed. A thickness of the TiN film that forms the second metal film 204a is about 5 nm, for example. This second metal film 204a is formed using a sputtering method, for example.

Then, a thermal treatment is performed for about 10 seconds under a temperature of 900° C. Thereby, as shown in FIG. 8-3, a reaction film 218a is formed in between the hafnium system insulator 103a and the first metal film 217 as a result of a thermal treatment reaction between the hafnium system insulator 103a and the first metal film 217. For example, in a case when a HfSiON film is formed as the hafnium system insulator 103a, the HfSiON film and the Ti being the constituent atom of the first metal film 217 react with each other to form a TiHfSiON film as the reaction film 218a. As in the case of the first embodiment, this reaction film 218a is formed as a result of a thermal treatment reaction between the first metal insulator 217 and parts of the surface of the hafnium system insulator 103a underneath the first metal film 217 which have been electrostatically damaged by plasma generated while the first metal film 217 was formed by sputtering. Accordingly, by forming the reaction film 218a through the thermal treatment, it is possible to compensate for the electrostatically damaged parts of the surface of the hafnium system insulator 103a. As a result, it is possible to reduce residual damages in the hafnium system insulator 103a.

Then, as shown in FIG. 8-3, as in the case of the first embodiment, a polysilicon film 105a is formed on the whole surface of the second metal film 204a to a thickness of about 80 nm, for example. Then, after implanting P" ions and $B^+$ ions into the n-MOS region and the p-MOS region in the polysilicon film 105a, respectively, a $SiN_x$ film 106a, as in the case of the first embodiment, is formed to a thickness of about 100 nm, for example.

Then, as in the case of the first embodiment, the $SiN_x$ film 106a, the polysilicon film 105a, the second metal film 204a, the reaction film 218a, the hafnium system insulator 103a, the $La_2O_3$ film 202a, the $SiO_2$ film 102a and the SiGe film 201a on the regions other than the gate electrode forming regions are sequentially etched using a photolithography technique. For example, the $SiN_x$ film 106a, the polysilicon film 105a, the second metal film 204a and the reaction film 218a are etched through anisotropic etching. Meanwhile, the hafnium system insulator 103a, the $La_2O_3$ film 202a and the $SiO_2$ film 102a are etched, for example, through wet etching using diluted Hf, for example. As a result, as shown in FIG. 8-4, in the n-MOS region, the gate insulator 21n as including the $SiO_2$ film 102, the threshold adjusting film 202 and the high-dielectric film 103 is formed to a length of about 30 nm in a gate length direction, for example, and the gate electrode 22n as including the metal electrode 204 and the polysilicon film 105n is formed to a length of about 30 nm in a gate length direction, for example. Moreover, in the p-MOS region, the gate insulator 21p as including the threshold adjusting film 201, the $SiO_2$ film 102 and the high-dielectric film 103 is formed to a length of about 30 nm in a gate length direction, for example, and the gate electrode 22p as including the metal electrode 204 and the polysilicon film 105p is formed to a length of about 30 nm in a gate length direction, for example. The reaction films 218, if they have insulation ability, will function as parts of the gate insulator 21n and 21p, respectively, or if they have conductivity, will function as parts of the gate electrodes 22n and 22p, respectively. The resist pattern used in the photolithography process is to be removed after the SiN$_x$ film 106a, the polysilicon film 105a, the second metal film 204a, the reaction film 218a, the hafnium system insulator 103a, the La$_2$O$_3$ film 202a, the SiO$_2$ film 102a and the SiGe film 201a on the regions other than the gate electrode forming regions are sequentially etched.

Then, as in the case of the first embodiment, after forming the SiO$_2$ film on the whole element face of the Si substrate 100, an etchback process is performed on this SiO$_2$ film. Thereby, as shown in FIG. 8-4, a structure in which the sidewall portions of the gate electrode patterns are surrounded by the SiO$_2$ films 107 are obtained. Then, after implanting As ions as a dopant, for example, into the Si substrate 100 in the n-MOS region, and implanting B$^+$ ions as a dopant, for example, into the Si substrate 100 in the p-MOS region, a thermal treatment for crystal compensation is performed for five seconds under a temperature of 800° C., for example. Thereby, the lightly doped regions 108n and 108p are formed, respectively. Then, after forming a SiN$_x$ film and a SiO$_2$ film, these SiN$_x$ film and SiO$_2$ film are etched back. Thereby, as shown in FIG. 8-5, sidewall films each of which including the SiO$_2$ film 107, the SiN$_x$ film 109 and the SiO$_2$ film 110 are formed in sidewall portions of the respective gate electrode patterns. Then, after implanting P$^+$ ions as a dopant, for example, into the Si substrate 100 in the n-MOS region, and implanting B$^+$ ions as a dopant, for example, into the Si substrate 100 in the p-MOS region, a thermal treatment for activating the implanted dopant is performed for five seconds under a temperature of 1030° C., for example. Thereby, the highly doped regions 111n and 111p are formed, respectively. Then, as in the case of the first embodiment, the silicide films 112 are formed on the gate electrodes 22n and 22p, and on the highly doped regions 111n and 111p, respectively. Then, as in the case of the first embodiment, the first interlayer insulator 113 shown in FIG. 7 is formed; the contact plugs 114 shown in FIG. 7 are formed; the second interlayer insulator 115 shown in FIG. 7 is formed on the whole surface of the Si substrate 100; and then the wirings 116 shown in FIG. 7 are formed. Thereby, the semiconductor device 2 as shown in FIG. 7 is obtained.

In this way, in manufacturing the semiconductor device 2 according to the second embodiment, as in the case of the first embodiment, the damage on the surface of the gate insulator caused by the formation of the metal film can be compensated by letting the metal film formed on the high-dielectric film 103 as separately from the metal film that forms the metal electrode 204 react with the surface layer of the high-dielectric film 103 through the thermal treatment. Therefore, the semiconductor device 2 can be manufactured as having reliability of the gate insulator and operability thereof being secured.

In the first embodiment, the second metal film is formed as a TaC film, while the first metal film is formed with Ta which is an element contained in the TaC film that forms the second metal film. In the second embodiment, the second metal film is formed as a TiN film, while the first metal film is formed with Ti which is an element contained in the TiN film that forms the second metal film. That is, in each of the above-described embodiments, constituent elements of the respective first and second metal films are being selected so that at least one of the elements contained in the first metal film and at least one of the elements contained in the second metal film should become the same. With such selection, in each of the above-described embodiments, it is possible to use the same etching gas throughout the processes of etching the second metal film and the first metal film in the anisotropic etching process for forming the electrode patterns. That is, it is possible to have the second metal film and the first metal film etched without having to change the chamber or the etching gas between the processes of etching the second metal film and the first metal film. Thereby, it is possible to facilitate the electrode pattern formation.

Furthermore, in the first embodiment, it is possible to select a highly reactive Ta$_2$C film for the first metal film, and a TaC film for the second metal film, for example. As in the case film mentioned above, in such case where the constituent elements of the respective first and second metal films are being selected so that at least one of the elements contained in the first metal film and at least one of the elements contained in the second metal film should become congeneric, it is possible to use the same etching gas and chamber throughout the processes of etching the second metal film and the first metal film. Thus, it is possible to facilitate the electrode pattern formation.

In each of the above-described first and second embodiments, selecting the constituent elements of the respective first and second metal films so that at least one of the elements contained in the first metal film and at least one of the elements contained in the second metal film should become the same or congeneric is not an essential requirement. That is, the first metal film is appropriate as long as it is a metal film which can react with the hafnium system insulator to form the reaction film as a result.

As an example, a way of selecting the constituent material of the first metal film will be described in terms of a case where HfSiO$_4$ is used as the hafnium system insulator. In this case, a kind of metallic material of which reaction progresses from the left side to the right side of the following Formula (1) can be selected as the first metal film.

$$Me + HfSiO_4 = MeO_x + HfO_2 + MeSi \quad (1)$$

A metallic material of which reaction progresses from the left side to the right side of this Formula (I) can be Ta as exemplified in the case of the first embodiment, Ti as exemplified in the case of the second embodiment, or else, may be V, Nb, Zr, Hf or the like, for example. Other than the above, a compound of V, Nb, Ta, Ti, Zr, Hf or the like, for example, may be applied as well. In this way, by selecting the metallic material from among V, Nb, Ta, Ti, Zr and Hf, or from among the compounds of V, Nb, Ta, Ti, Zr and Hf to be used as the first metal film, the damage on the surface of the hafnium system insulator can be compensated as explained in the above-described cases of the embodiments.

Each of the first and the second embodiments has been described in terms of the case where the hafnium system insulator such as the HfSiON film, the HfO$_2$ film, the HfSiO film, or the like, is used in forming the gate insulator. However, each of the above-described embodiments is not limited to such case. For example, the high-dielectric film 103 may be formed with a kind of an insulator directly on which the metal film that forms the metal electrode can be formed. As such kind of insulator, for example, an insulator including one of the following can be applied: an oxide of one of Zr, Ti, Ta, Al, Sr, Y and La; an oxide of silicon and one of Zr, Ti, Ta, Al, Sr, Y and La, such as ZrSixOy; and a silicon oxide film. Moreover, it is possible to form a laminated film with these oxide films to be an insulator to substitute for the high-dielectric film 103.

In each of the first and the second embodiments, a thermal treatment for letting the first metal film 117/217 and the hafnium system insulator 103a react with each other is carried out after the formations of the first metal film 117/217 and the second metal film 104a/204a. However, each of the above-described embodiments is not limited to such case. That is, in order to achieve the advantageous effects of each of the above-described embodiments, it is appropriate enough as long as it is possible to let the first metal film 117/217 and the damaged parts of the surface of the hafnium system insulator 103 react with each other. In this respect therefore, the thermal treatment for prompting reaction between the first metal film 117/217 and the hafnium system insulator 103*a* may be carried out before the formation of the second metal film 104*a*/204*a*.

Although each of the first and the second embodiments has been described in terms of the case where the thermal treatment (e.g. thermal treatment of about 10 seconds under a temperature of 900° C.) for letting the first metal film 117/217 and the hafnium system insulator 103*a* react with each other is carried out in one independent processing step, each of the above-described embodiments is not limited to such case. For example, if such thermal treatment at a temperature over 900° C. with which the first metal film 117/217 and the damaged parts of the surface of the hafnium system insulator 103*a* can be made to react with each other is to be carried out in the subsequent processing step, it is possible to omit the independent thermal treatment for prompting reaction between the first metal film 117/217 and the hafnium insulator 103*a*. Moreover, in each of the above-described embodiments, since it is appropriate enough as long as at least the damaged parts of the surface of the hafnium system insulator 103*a* can react with the first metal film 117/217, it is not necessary to let the first metal film 117/217 in whole react with the hafnium system insulator 103*a*.

Furthermore, although each of the first and the second embodiments has been described in terms of the case where the Si substrate 100 is used, each of the above-described embodiments is not limited to such case in that the Si substrate 100 is used. For example, a SOI substrate, a SiC substrate, or the like, may be used for reliably preventing possible interelement leakage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
 a gate insulator formed on a substrate, the gate insulator including a high-dielectric film in whole or part;
 a reaction film including a first metal on the gate insulator;
 a metal film including a second metal on the reaction film, the second metal being made with a different composition from that of the first metal, and a thermal stability of the second metal being greater than that of the first metal; and
 a film including Si formed on the metal film.

2. The semiconductor device according to claim 1, wherein the first metal includes at least one of V, Nb, Ta, Ti, Zr and Hf, or at least one compound of one of V, Nb, Ta, Ti, Zr and Hf, and
 the high-dielectric film includes at least one oxide of one of Hf, Zr, Ti, Ta, Al, Sr, Y and La, at least one oxide of silicon and one of Zr, Ti, Ta, Al, Sr, Y and La, or silicon oxide.

3. The semiconductor device according to claim 1, wherein the high-dielectric film includes a hafnium system insulator.

4. The semiconductor device according to claim 1, wherein the gate insulator in at least a part thereof includes a threshold adjusting film for controlling an operational threshold of the semiconductor device.

5. A semiconductor device comprising:
 a gate insulator formed on a substrate, the gate insulator including a high-dielectric film in whole or part;
 a reaction film formed as a result of thermal reaction between at least a part of the high-dielectric film and a first metal;
 a metal film including a second metal on the reaction film, the second metal being made with a different composition from that of the first metal, and a thermal stability of the second metal being greater than that of the first metal; and
 a film including Si formed on the metal film.

6. The semiconductor device according to claim 5, wherein the first metal includes at least one of V, Nb, Ta, Ti, Zr and Hf, or at least one compound of one of V, Nb, Ta, Ti, Zr and Hf, and
 the high-dielectric film includes at least one oxide of one of Hf, Zr, Ti, Ta, Al, Sr, Y and La, at least one oxide of silicon and one of Zr, Ti, Ta, Al, Sr, Y and La, or silicon oxide.

7. The semiconductor device according to claim 5, wherein a damage in the high-dielectric film which has occurred at a time of forming the first metal film is compensated by forming the reaction film.

8. The semiconductor device according to claim 7, wherein the first metal includes at least one of V, Nb, Ta, Ti, Zr and Hf, or at least one compound of one of V, Nb, Ta, Ti, Zr and Hf, and
 the high-dielectric film includes at least one oxide of one of Hf, Zr, Ti, Ta, Al, Sr, Y and La, at least one oxide of silicon and one of Zr, Ti, Ta, Al, Sr, Y and La, or silicon oxide.

9. The semiconductor device according to claim 5, wherein the gate insulator in at least a part thereof includes a threshold adjusting film for controlling an operational threshold of the semiconductor device.

* * * * *